(12) United States Patent  
Kim

(10) Patent No.: US 7,268,403 B2
(45) Date of Patent: Sep. 11, 2007

(54) POWER SEMICONDUCTOR DEVICE HAVING AN IMPROVED RUGGEDNESS

(75) Inventor: Jong-Min Kim, Incheon (KR)

(73) Assignee: Lite-On Semiconductor Corp., Taipei, Taiwan (CN)

( * ) Notice: Subject to any disclaimer, the term of this patent is extended or adjusted under 35 U.S.C. 154(b) by 0 days.

(21) Appl. No.: 11/199,147

(22) Filed: Aug. 9, 2005

(65) Prior Publication Data

US 2006/0049458 A1    Mar. 9, 2006

(30) Foreign Application Priority Data

Sep. 9, 2004    (KR)    ............. 10-2004-0072068

(51) Int. Cl.
 *H01L 29/76*  (2006.01)
 *H01L 29/94*  (2006.01)
 *H01L 31/062* (2006.01)
 *H01L 31/113* (2006.01)
 *H01L 31/119* (2006.01)

(52) U.S. Cl. ............ 257/401; 257/341; 257/288
(58) Field of Classification Search ........... 257/288, 257/341, 401, 901
See application file for complete search history.

*Primary Examiner*—Monica Lewis
(74) *Attorney, Agent, or Firm*—Birch, Stewart, Kolasch & Birch, LLP

(57) ABSTRACT

The power semiconductor of the invention consists of an n+ drain area; an n– epitaxial area; p– body and p+ body areas formed on top of the n– epitaxial area in a striped configuration; an n° epitaxial area formed on the n– epitaxial area and between the p– body and p+ body areas; a p-type edge area formed beneath the n° epitaxial area to connect with the two ends of the p+ body area; an n+ source area formed on two sides of the p– body area; gate dielectrics formed on top of the n+ body area, the p– body area, and the n° epitaxial area; and gate electrodes formed on the gate dielectrics. The p-type edge section of the power semiconductor of the invention consists of multiple sub-areas that prevent ruggedness current from concentrating on the p+ body area and thereby improve the ruggedness of the power semiconductor.

6 Claims, 8 Drawing Sheets

POWER SEMICONDUCTOR DEVICE HAVING AN IMPROVED RUGGEDNESS

BACKGROUND OF THE INVENTION

1. Field of the Invention

This invention pertains to power semiconductors and in particular to a power metal oxide semiconductor field effect transistor (hereinafter referred to as power MOSFET) featuring improved ruggedness.

2. Description of Related Art

The power MOSFET features a high breakdown voltage and low on-resistance in DC mode and fast switching rate (i.e., low switching loss value) in AC mode. The on-resistance of the power MOSFET consists mainly of channel resistance, JFET resistance, accumulation resistance, and epitaxial resistance (a.k.a. drift resistance). Here, the epitaxial resistance comes to make up for majority of the on-resistance as the rated voltage increases. In addition, the power MOSFET requires greater breakdown voltage with an increase in rated voltage. The thickness and resistivity of the epitaxial layer must be increased in order to accommodate this, but an inevitable outcome of increasing the two factors is the concurrent increase of the epitaxial layer's on-resistance. The on-resistance value and the breakdown voltage value in a power MOSFET, therefore, form a trade-off relationship, and such relationship must be weighed heavily in designing power MOSFETs.

Residing inside the power MOSFET is an NPN parasitic bipolar transistor. Once initiated within the MOSFET, it is possible for the transistor to latch while in "on" state (Not MOSFET on, but NPN Tr is on) and ultimately destroy the power MOSFET. Therefore, it is crucial that the power MOSFET is rugged enough to counter the actions of the parasitic bipolar transistor. And the key to manufacturing such power MOSFET featuring high ruggedness is appropriate dispersion of the ruggedness current flowing within the power MOSFET. Here, ruggedness current refers to the current flowing through the diode (pn-junction diode) when reverse current is impressed on the power MOSFET.

FIG. 1(a) illustrates a power MOSFET (100) featuring the conventional closed patterned cell structure, whereas FIG. 1(b) illustrates a sectional view along line A-A' in FIG. 1(a). The gap between the hexagonal cells in FIG. 1(a), which is the gate pitch corresponding to "d" in FIG. 1(a), is equidistant in order to yield greater channel density per surface area. The resolution capacity of photolithography devices must be considered, however, when designing the gate pitch because each of the cells must accommodate an n+ source area.

The following refers to FIG. 1(a) and FIG. 1(b) and describes a power MOSFET featuring the conventional hexagonal layout. An n– epitaxial area (130) is formed on top of an n+ drain area (120), where the thickness and resistance values of the n– epitaxial area (130) function as key factors in determining the actual breakdown voltage and on-resistance values of the power MOSFET. p– body areas (142) are formed in regular intervals on the n-epitaxial area (130). n+ source areas (160) are then formed on two internal ends of the p-body area (142), close the p– body area's (142) upper surface. p+ body areas (141) form within the p– body area (142), between the n+ source areas (160). Gate dielectrics (155) interpose over the p– body areas (142), n– epitaxial area (130), and n+ source areas (160) to form gate electrodes (150). A source electrode (180) and a n+ source areas (160) are formed on top of the p+ body area (141) and the n+ drain area (110) and underneath the n+ drain area (120). Formed on top of the gate electrodes (150) are PSG (phosphosilicate glass) layers (170) that isolate the gate electrodes (150) from the source electrodes (180).

The above-described power MOSFET features a hexagonal design for greater cell density and minimizes dead zones for lowered on-resistance. This design also increases the channel density per surface area, allowing for lower on-resistance than any other design.

The depletion layer in hexagonal power MOSFETs, however, take a spherical form when reverse voltage is impressed between the drain and source, causing the critical current density to geometrically concentrate on the spherical shape and lowering the breakdown voltage. In respect to alternating current properties, the hexagonal power MOSFET also performs at a low switching rate. The capacitance between the power MOSFET's gate electrode and the drain electrode (Cgd) determines its switching rate, where Cgd is determined by the epitaxial area covered by the gate electrodes between body areas. The greater the epitaxial layer coverage, the greater the Cgd, and this results in a decreased switching rate and greater heat radiation from the MOSFET. Ergo, gate electrodes in polygonal power MOSFETs inevitably cover a greater area of the epitaxial layer, resulting in increased Cgd and a lowered switching rate.

To resolve this problem inherent in the above-described hexagonal power MOSFET, a stripe cell-structured design was developed. This design is described below, in references to FIG. 2(a), FIG. 2(b), and FIG. 2(c). FIG. 2(a) illustrates a power MOSFET (100) featuring a striped cell configuration, whereas FIG. 2(b) illustrates a sectional view along line B-B' in FIG. 2(a). As shown in the two diagrams, the striped power MOSFET (200) is very similar in design to the hexagonal power MOSFET (100) in FIG. 1(a) and FIG. 1(b), except that here the p+ body areas (241) and gate electrodes (250) are striped. The striped power MOSFET also consists of drain electrodes (210), n+ drain areas (220), n– epitaxial areas (230), p+ bodies (241), p– bodies (242), gate electrodes (250), gate dielectrics (255), n+ source areas (260), and source electrodes (280). FIG. 2(c) illustrates the relationship between the p+ body areas (241) and the p-type edge area (244) in a striped power MOSFET. In a normal striped power MOSFET, the p+ areas are comprised of striped p+ body areas (241) that are surrounded by a p-type edge area (244). Both ends of the p+ body areas (241) are attached to the p-type edge area (244), which is fabricated as a single unit.

With a striped configuration, the above-described power MOSFET can effectively resolve the problem associated with hexagonal power MOSFETs by offering improved breakdown voltage and switching rate.

The power MOSFET shown in FIG. 2(a) through (c), however, is still problematic in that electrical current flows mainly through the p+ body areas. Current then concentrates on those areas to activate the parasitic bipolar transistor and ultimately destroys the power MOSFET.

Accordingly, as discussed above, the prior art still has some drawbacks that could be improved. The present invention aims to resolve the drawbacks in the prior art.

SUMMARY OF THE INVENTION

As a solution to the problem posed above, this invention retains the objective of presenting a power semiconductor having p– type areas comprised of multiple, separated sub-areas that allow even dispersion of current throughout the entire p-type edge area.

In addition, the invention also retains the objective of presenting a power semiconductor possessing improved ruggedness.

Other objectives of the invention shall be described in detail within the detailed description and claims sections.

Numerous additional features, benefits and details of the present invention are described in the detailed description, which follows.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF PREFERRED EMBODIMENTS

For the above objectives, this invention presents a power semiconductor having a drain area of conductivity type 1; a primary epitaxial area of conductivity type 1, arranged on top of the drain area; multiple primary and secondary body areas of conductivity type 2, arranged on top of the primary epitaxial area in a stripe configuration; a secondary epitaxial area of conduction type 1, formed between primary body areas; an edge area of conduction type 2, formed below the secondary epitaxial area to surround the second body areas and connected to the two ends of the second body areas; multiple source areas of conduction type 1, formed within a specific area within the primary body areas; and gate dielectrics formed on the source areas, primary body areas, and secondary epitaxial areas; and the edge area is formed with multiple sub-areas.

In the power semiconductor presented in this invention the separated sub-areas should employ rounded edges.

In the power semiconductor presented in this invention the separated sub-areas should have gaps no longer than the gap between secondary body areas.

The power semiconductor presented in this invention further includes source electrodes formed to make electrical connection with the source areas, where the source electrodes' two ends are arranged to be closer to the edge area than the ends of the source areas.

Furthermore, for the above objectives, this invention presents a power semiconductor having a drain area of conductivity type 1; a primary epitaxial area of conductivity type 1, arranged on top of the drain area; multiple primary and secondary body areas of conductivity type 2, arranged on the primary epitaxial area in a stripe configuration; a secondary epitaxial area of conduction type 1, formed between primary body areas; an edge area of conduction type 2, formed below the secondary epitaxial area to surround the second body areas and connected to the two ends of the second body areas; multiple source areas of conduction type 1, formed within a specific area within the primary body areas; and gate dielectrics formed on the source areas, primary body areas, and secondary epitaxial areas; and the edge area is comprised of sharp and blunt sections, where the blunt section is concavo-convex.

In the invention's power semiconductor, the concavo-convex section's convexities should be spherical.

The power semiconductor in this invention further includes source electrodes formed to electrically connect with the source area, where the two ends of the source electrodes should be arranged closer to the edge area than the ends of the source area.

Conduction type 1 can be n-type, and conduction type 2 can be p-type, whereas the semiconductor can be a power MOSFET.

The edge area should not come in contact with a high density, conduction type 1 area.

Figure 3:
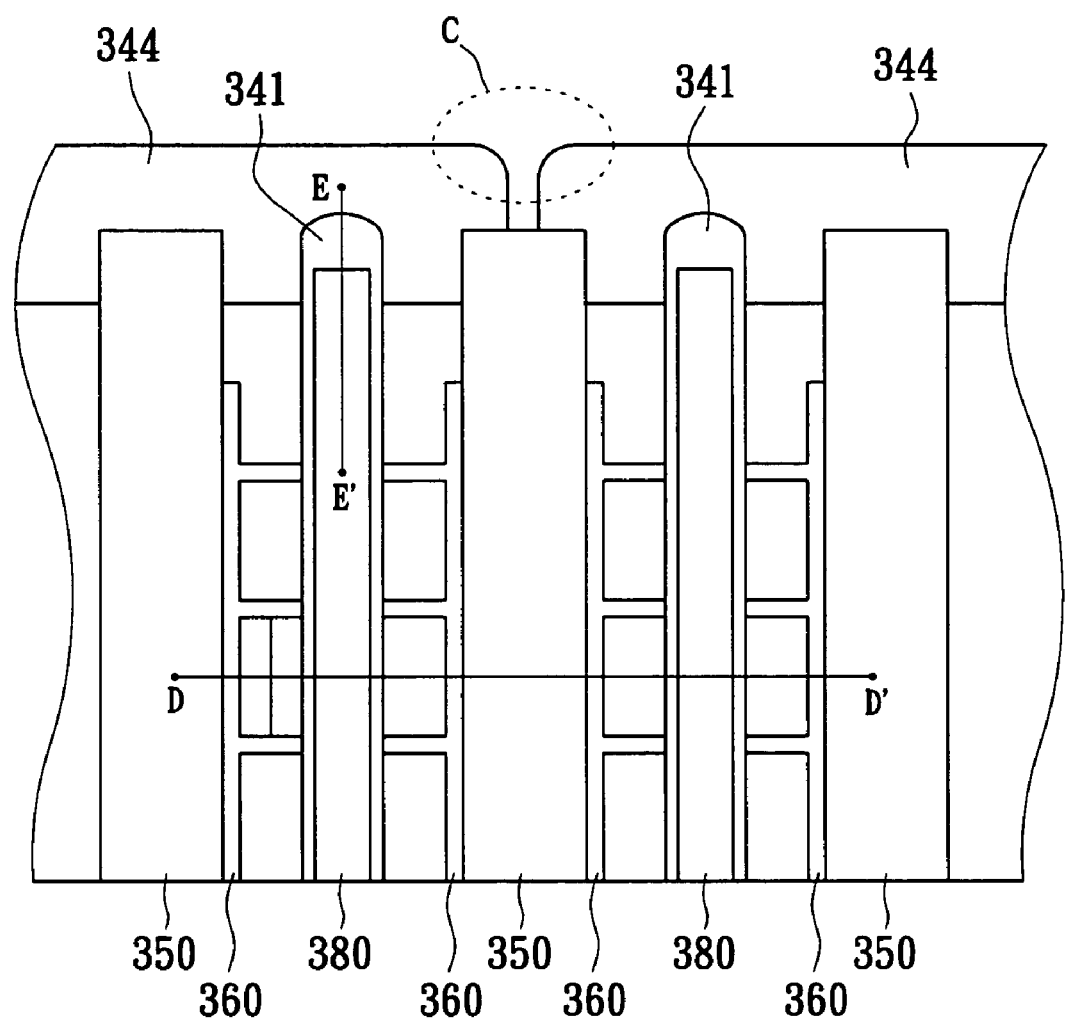
FIG. 3 illustrates part of the power MOSFET as per this invention.
Figure 4:
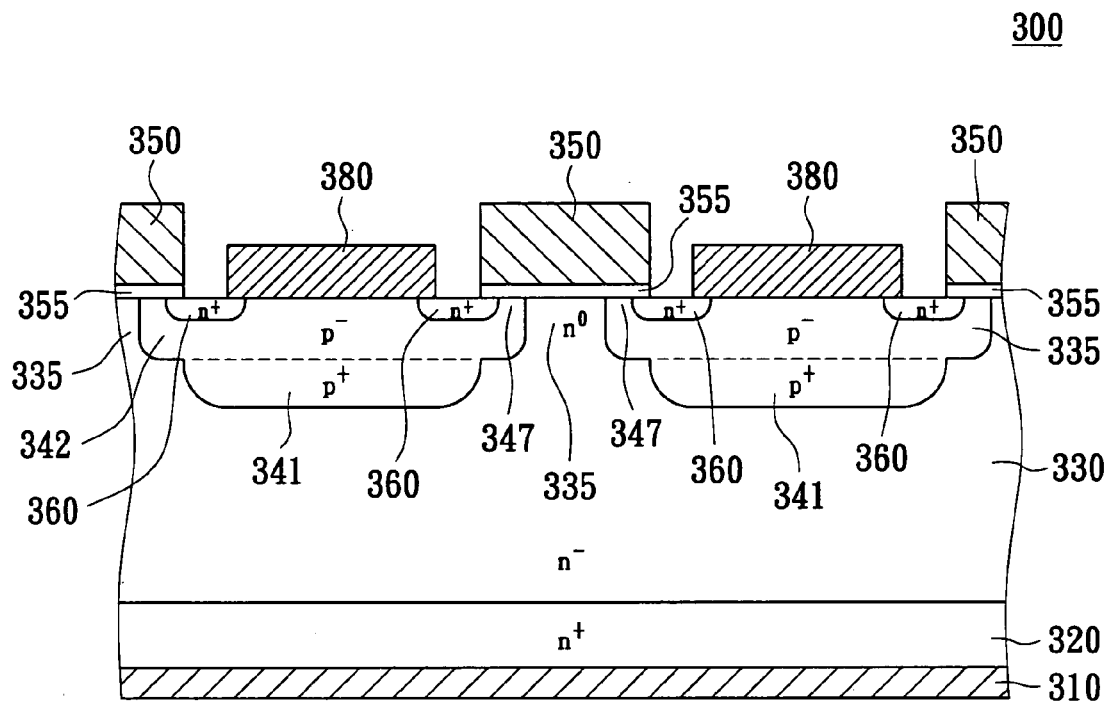
FIG. 4 illustrates a sectional view along line D-D' of FIG. 3.
Figure 5:
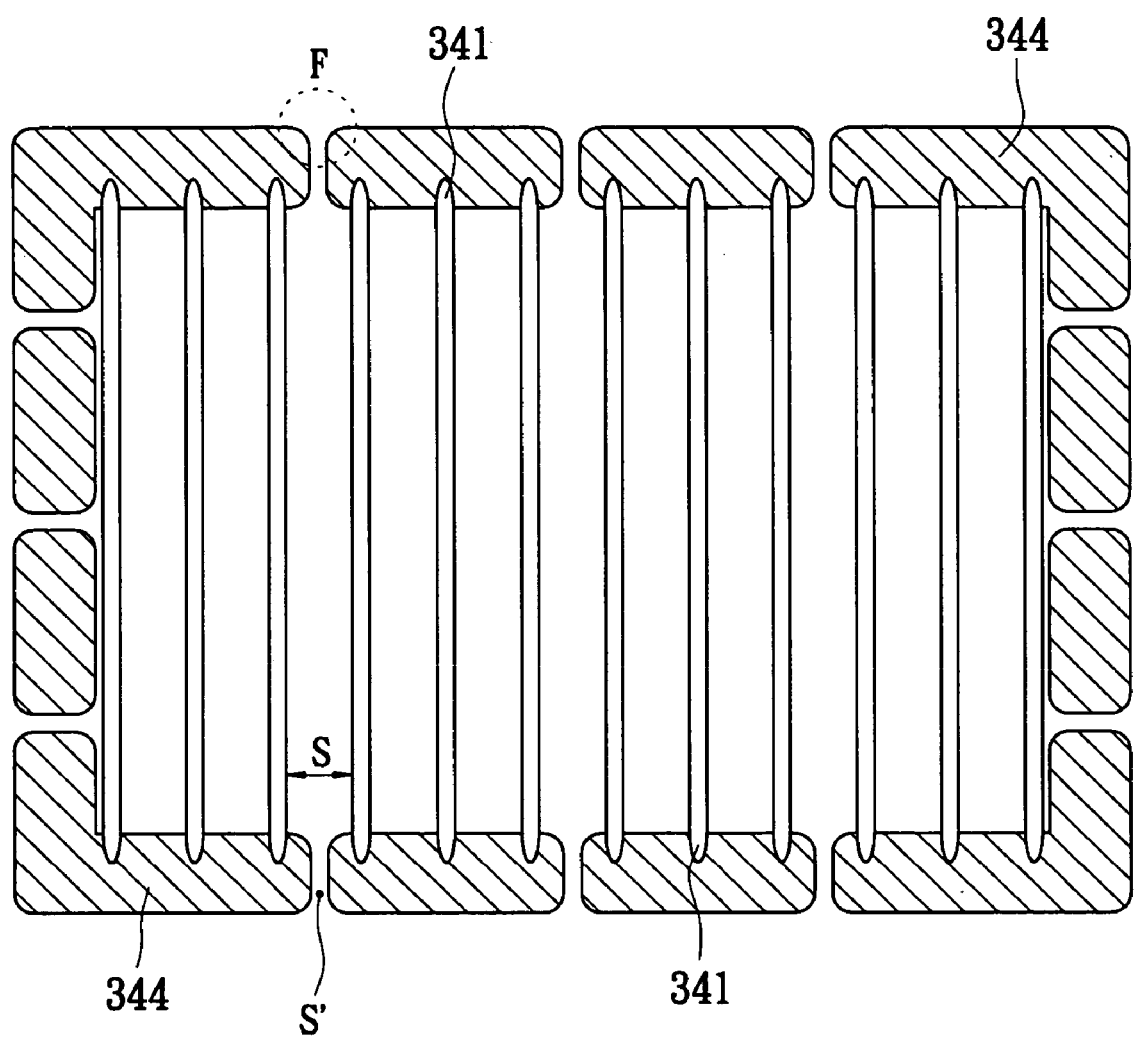
FIG. 5 illustrates the p+ body and p-type edge areas of FIG. 3.

Following is a description of the components and mechanisms of a power MOSFET (300) as per this invention, in references to FIG. 3, FIG. 4, and FIG. 5.

FIG. 3 is a partial illustration of the power MOSFET as per this invention, whereas FIG. 4 illustrates a sectional view along line D-D' in FIG. 3. In both diagrams, 310 is the drain electrode, 320 is the n+ drain area, 330 is the n− epitaxial area, 335 is the n° epitaxial area, 341 is the p+ body area, 342 is the p− body area, 344 is the p-type edge area, 350 is the gate electrode, 355 is the gate dielectrics, 360 is the n+ source area, and 380 is the source electrode. For the sake of convenience, not all components shown in FIG. 4 are shown in FIG. 3.

The striped power MOSFET as per this invention consists of gate electrodes and p+ body areas arranged in a striped configuration as shown in FIG. 3. p+ body areas (341), n+ source areas (360) and source electrodes (380) arranged between the gate electrodes (350). Two ends of all p+ body area (341) come in contact with the p-type edge area (344). Here, the p-type edge area (344) is not a single unit, but rather comprised of multiple sub-areas. This is one of the invention's technical features and is illustrated in further detail in FIG. 5.

Following describes working mechanisms of the power MOSFET as per this invention, in references to FIG. 4. n− epitaxial area (330) is formed on the n+ drain area (320) on top of a silicon wafer substrate using a silicon epitaxy technique. Here, thickness and resistance values of the n− epitaxial area (320) determines the breakdown voltage and on-resistance values of the power MOSFET for the same aforementioned reasons for conventional technologies. n° epitaxial area (335) is then formed on top of the n− epitaxial area (330) using the JFET (Junction Field Effect Transistor) ion implantation technique. The JFET ion implantation refers to a process of forming a higher density epitaxial area on the n− epitaxial area (330) via ion implantation of n-type dopant for the purpose of lowering the on-resistance of the power MOSFET. Because such n° epitaxial area (335) formed between the p− body areas (342) is known in the field of power MOSFETs as the JFET area, the above-described process is referred to as the JFET ion implantation method.

Multiple p+ and p− body areas (341, 342) are formed at regular intervals over a specific range within the n° epitaxial area (335). The p+ (341) and p− (342) body areas are formed using the well drive in technique, which is a method in which a p-type dopant is ion implanted and then expanded within the n° epitaxial area (335) using diffusion processing. The double well drive in technique, which ion implants p-type dopant to match p+ and p− densities, is the more conventional method used to form p+ and p− bodies in power MOSFETs.

n+ source areas (360) are formed on the two upper ends within the p− body area (342). Gate dielectrics (355) then interpose over a certain range of the n+ source area (360), a certain range of the p− body area (342), and over the n° epitaxial area's (335) surface between the p− body areas (342) to form gate electrodes (350). Here, the p− body area (347) covered by the dielectric is where a channel forms when the power MOSFET is activated.

Impressing positive voltage (gate voltage) on the gate electrode (350) inverts the p− body area to convert to an n-type channel area (347). Electricity released from source-drain voltage within the n+ source area (360) then travels through the n-type channel area (347), the n° epitaxial area (335), and the n-epitaxial area (330) to ultimately reach the n+ drain area (320), resulting in drain current output from the power MOSFET. Lastly, drain (310) and source (380) electrodes are formed to electrically connect with the n+ drain area (320) and n+ source area (360), respectively, and PSG layers (not shown) are formed on top of the gate electrode (350) to isolate the gate electrode (350) from the source electrode (380).

FIG. 5 illustrates the relationship between the p+ body area and p-type edge area in the striped power MOSFET as per this invention. For the purpose of providing a description of this relationship, FIG. 5 illustrates the p+ body area (341) and the p-type edge (344) only. The p-type edge area (344), as described previously in FIG. 3, does not feature the conventional single unit design (refer to FIG. 2(c)), but rather employs multiple sub-areas. The description below explains in detail of the reason why a p-type edge area (344) comprised of multiple sub-areas is used in the power MOSFET presented in this invention.

As mentioned before, breakdown voltage is a key factor in evaluating power MOSFETs, and its most influential factor is the depletion area structure of the pn-junction diode (hereinafter referred to as the junction diode) that exists within the power MOSFET. Breakdown voltage is generally higher in junction diodes with a flat depletion area than junction diodes with a cylindrical or spherical depletion area. From the latter, breakdown voltage in junction-diodes with a cylindrical depletion area is higher. Since the matter of variance in breakdown voltage in power MOSFET as per the junction diode design has been well documented, further description will be omitted from this point on. In reference to the power MOSFET in FIG. 2(c), the junction diodes in the p+ body area (241) and the p-type edge area (244) are both cylindrical in shape. Both ends of the p+ body area (241) imbricate over and connect to the p-type edge area (244), preventing a decrease of the breakdown voltage that would otherwise take place if the two ends of the p+ body area (241) were spherical in shape. This is also the same reason why the p-type edge area (244) in power MOSFETs are generally formed along the entire outer edge of the p+ body area (241). In other words, the p-type edge area (244) featuring cylindrical junction diodes and the two ends of the p+ body area (241) imbricate one another to eliminate the spherical junction diode configuration of the p+ body area (241) and prevent lowering of the breakdown voltage. The p-type edge area (244) does have four outermost corners that are spherical in shape, but the overall surface area claimed by these spherical structures in the p-type edge area (244) is negligible and it can still be claimed that the p-type edge area (244) has an overall cylindrical junction shape.

Figure 1A:
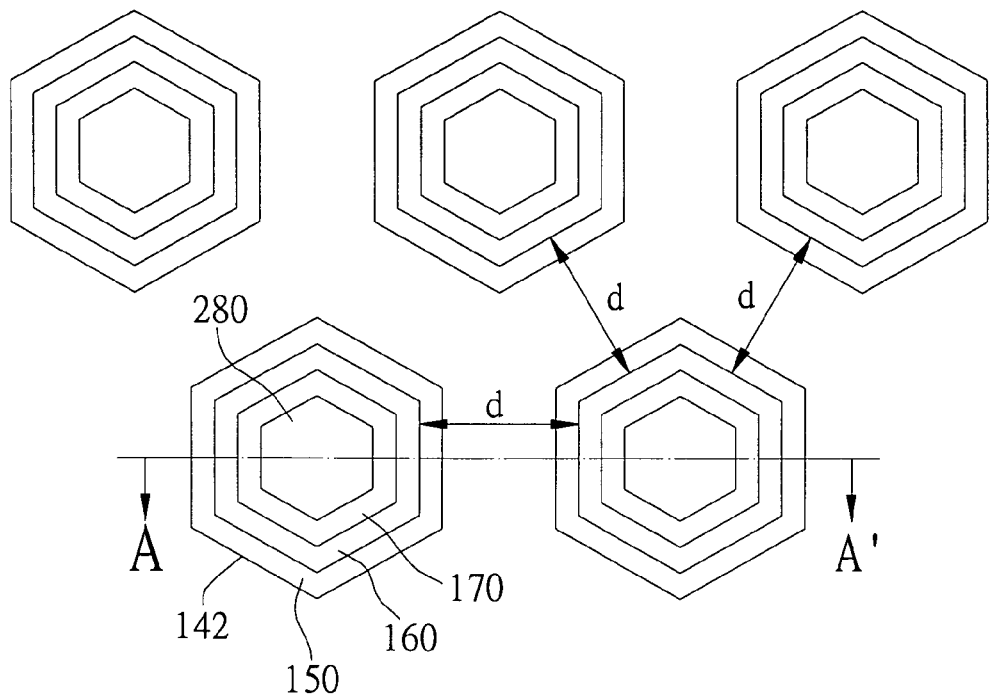
FIG. 1(a) illustrates a power MOSFET with a conventional hexagonal configuration.
Figure 1B:
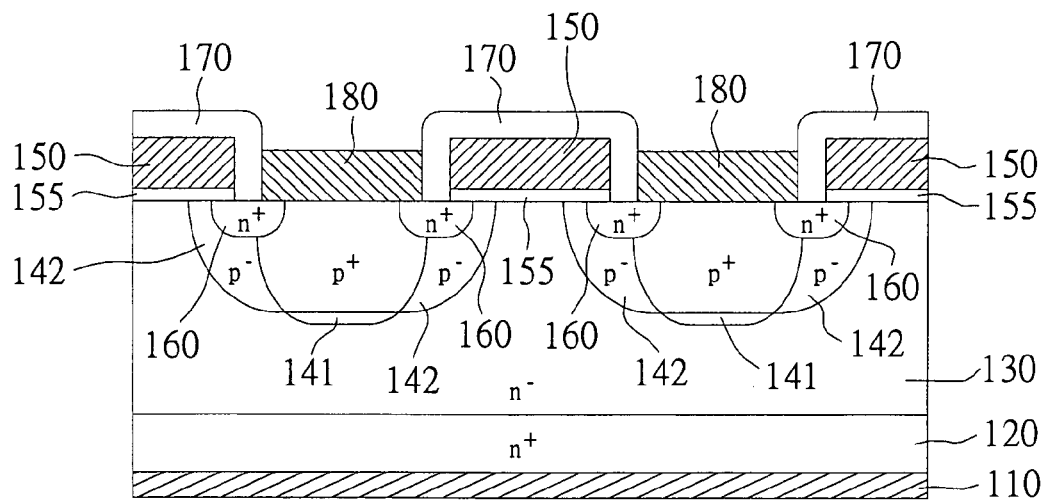
FIG. 1(b) illustrates a sectional view along line A-A' of FIG. 1(a).
Figure 2A:
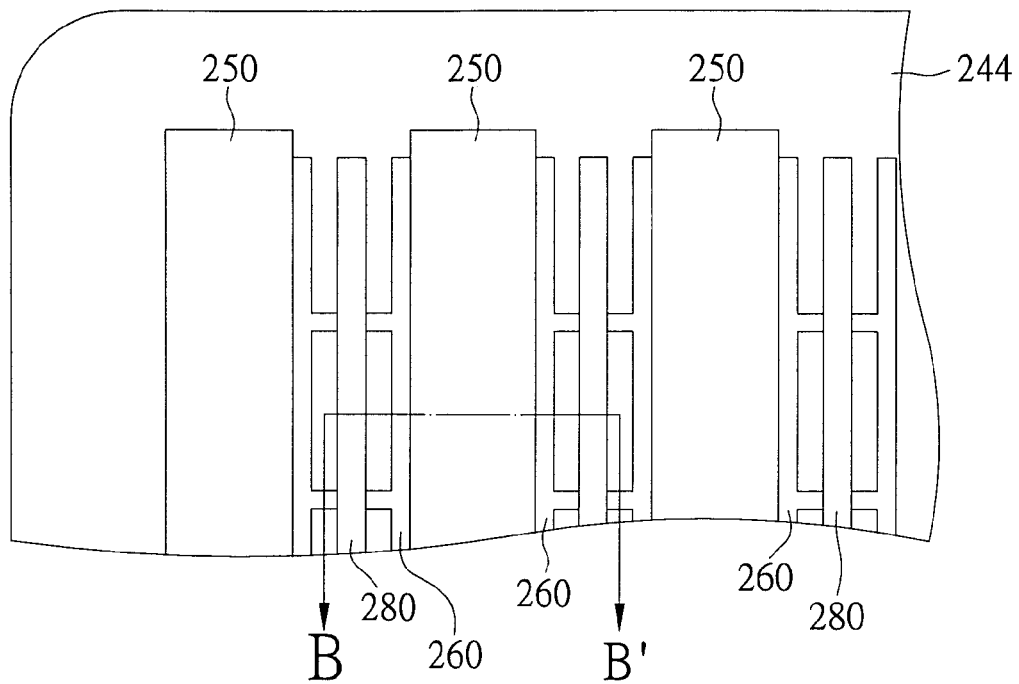
FIG. 2(a) illustrates a power MSOFET with a conventional striped configuration.
Figure 2B:
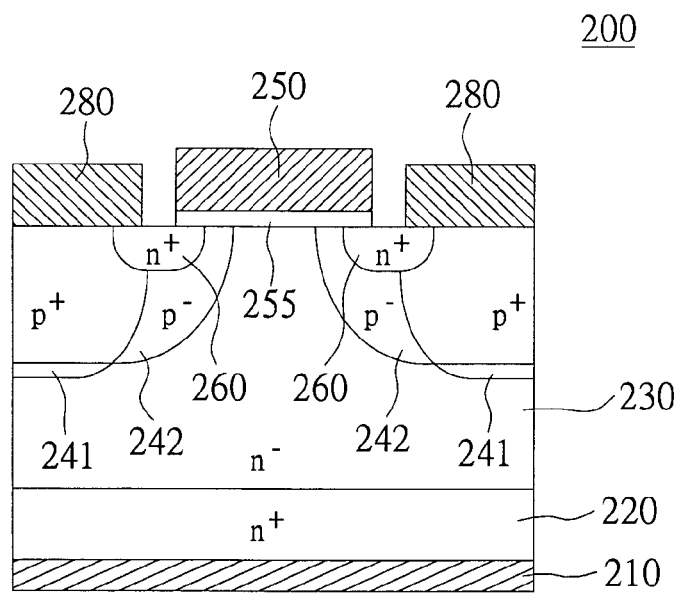
FIG. 2(b) illustrates a sectional view along line B-B' of FIG. 2(a).
Figure 2C:
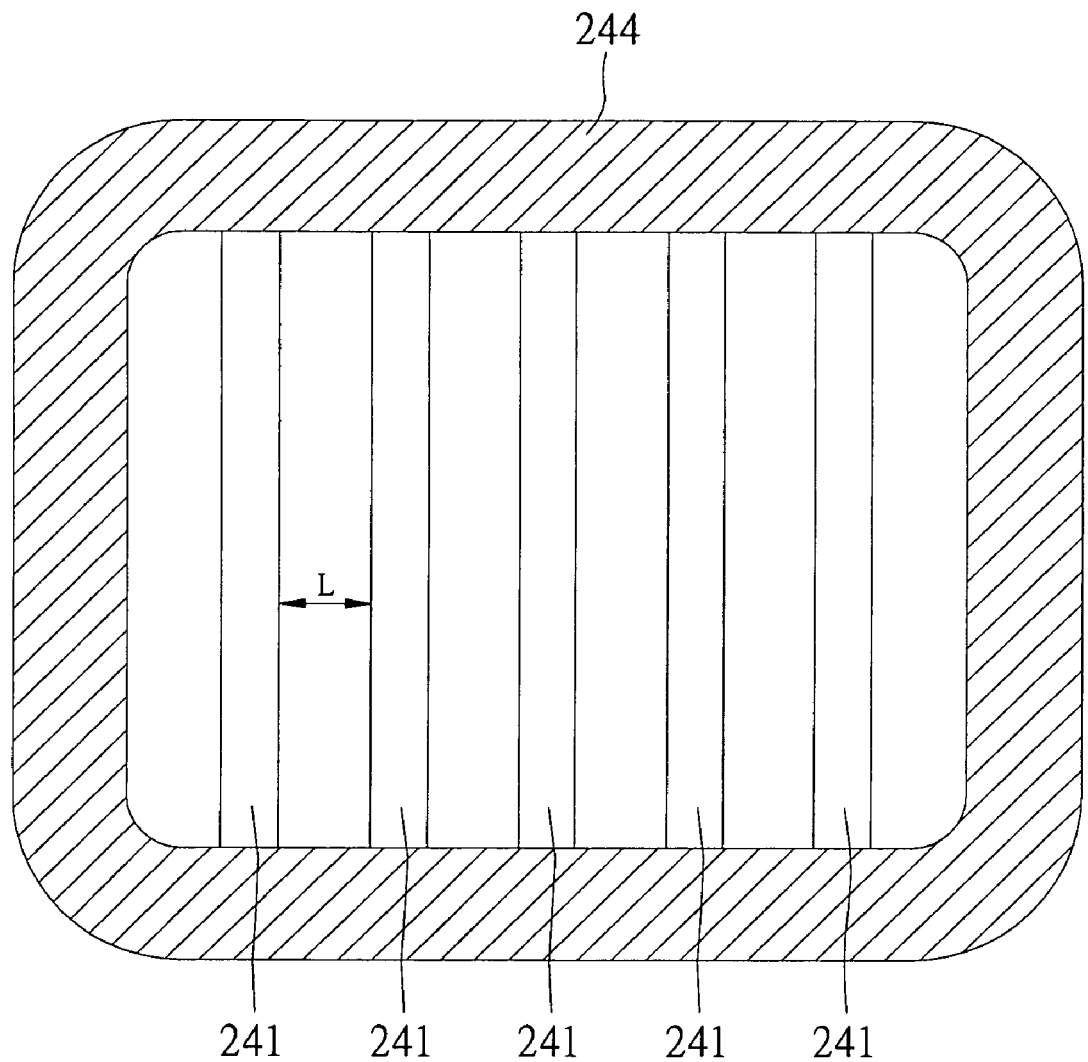
FIG. 2(c) illustrates the p+ body and p-type edge areas of FIG. 2(a).

Single unit p-type edge area (244) designs like the one shown in FIG. 2(c) are, however, incapable of dispersing current, and thereby pose a severe risk of MOSFET destruction. Although it has just been described that both p+ body area (241) and p-type edge area (244) bear a cylindrical shape, arrangement of the p+ body area (241) forces the p+ body area's (241) breakdown voltage to be lowered than the breakdown voltage of the p-type edge area (244). The reason behind this is that the multiple p+ body areas (241) arrange in a specific interval "L" and with the depletion area coming in contact with one another. The electric field caused by the drain-source voltage of the power MOSFET then concentrated on those contact points and lowers the breakdown voltage. To reiterate, conventional power MOSFETs with a single unit p-type edge area has higher breakdown voltage in the p-type edge area (244) than the p+ body area (241) and the difference between the two voltages is great. As mentioned before, ruggedness current is the current flowing through the diode (pn junction) when reverse direction voltage (drain-source voltage) is impressed on the power MOSFET; therefore, ruggedness current flows through areas with low breakdown voltage. And in conventional power MOSFETs, majority of the ruggedness current traveled through the p+ body area (241) and failed to disperse properly.

When ruggedness current flows undistributed and mostly through the p+body area (241), a parasitic NPN bipolar transistor within the power MOSFET becomes activated and threatens to destroy the power MOSFET itself. Of course, the p-type edge area (244) also reaches the breakdown voltage and the ruggedness current flows through the p-type edge area, but the variance between the breakdown voltage level in the p-type edge area (244) and the p+ body area (241) is too great in conventional structures as shown in FIG. 2(c) that the time it takes for the p-type edge area (244) to reach the breakdown voltage after the p+ body area (241) has reached it is long, making it difficult for the ruggedness current to disperse properly.

Conversely, the p-type edge area (344) of the power MOSFET as per this invention is divided into multiple sub-areas as shown in FIG. 5. The p-type edge area (344) in this invention has been designed with multiple sub-areas to provide the p-type edge area (344) with a spherical depletion area. The section marked "F" in FIG. 5 is where the spherical depletion area is formed by dividing the p-type edge area (344) into multiple sub-areas. When the p-type edge area (344) is given a spherical depletion area as shown, its breakdown voltage is lowered, although it is not below but closer to the breakdown voltage level at the p+ body area (341). Thus, the time gap between the p+ body area (341) reaching the breakdown voltage and the p-type edge area (344) reaching the breakdown voltage is shortened greatly over the conventional designs so that the ruggedness current flows through the p-type edge area (341) shortly after it has passed through the p+ body area (341), allowing for appropriate dispersion of the ruggedness current. Evenly dispersed ruggedness current then prevents the parasitic bipolar transistor within the power MOSFET from activating and significantly lowers the possibility of destroying the MOSFET.

The gap between the sub-areas (S' in FIG. 5) is critical when sub-dividing the p-type edge area (344). For the same reason noted for gap L in FIG. 2(c), if S' becomes too large, the depletion areas come to have sharp sections when coming in contact with other depletion areas, causing the electric field generated by the power MOSFET's drain-source voltage to concentrate on those sharp sections and lower the breakdown voltage of the p-type edge area (344). Considering that power MOSFETs operate with lower breakdown voltage at the p-type edge area (344) than the p+ body area (341), gap S' should be narrower than gap S (between p+ body areas (341)).

It is also proper to sub-divide the p-type edge area (344) into as many sub-areas as possible. Higher the number of sub-areas, higher the spherical depletion areas (F in FIG. 5) formed on the p-type edge area (344) and subsequently lowered breakdown voltage at the p-type edge area (344).

Figure 6:
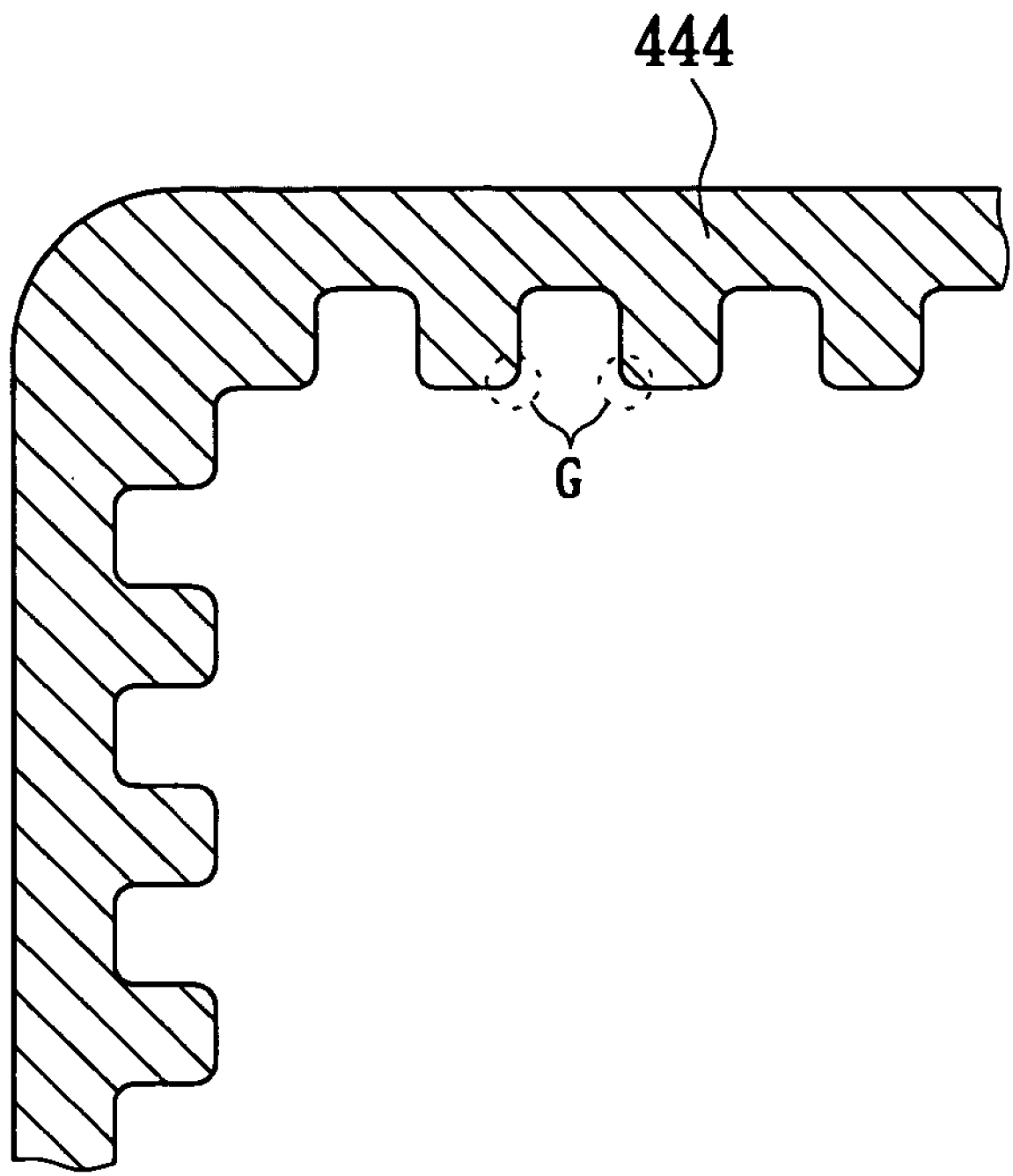
FIG. 6 illustrates another variation of the p-type edge area in the striped power MOSFET as per this invention.

If the breakdown voltage at the p-type edge area can be lowered by increasing the number of spherical depletion areas, there would be no need to sub-divide the p-type edge area as shown in FIG. 5. FIG. 6 illustrates another variation of the p-type edge area (444) as per this invention, where only a segment is shown for the sake of convenience. The p-type edge area (444) in FIG. 6, though not sub-divided as with in FIG. 5, possesses more spherical depletion areas (G) than the structure shown in FIG. 2(c). This also produces lowered breakdown voltage and proper dispersion of the ruggedness current.

Referring back to FIG. 3, another feature of this invention that ensures proper dispersion of the ruggedness current is described. The source electrodes (380) in FIG. 3 extend past the n+ source area (360) and closer towards the p-type edge area (380). The reason for this design is to force the ruggedness current that flows through the p-type edge area (344) to reach the source electrode (380) before the n+ source area (260). If the end of the n+ source area (360) were to be arranged closer to the p-type edge area (344) than the end of the source electrode (380), the ruggedness current that flows through the p-type edge area (344) would pass through the n+ source area (260) and flow through the source electrode (380), resulting in increased ruggedness current value. The increase then might activate the parasitic bipolar transistor and destroy the MOSFET.

Figure 7:
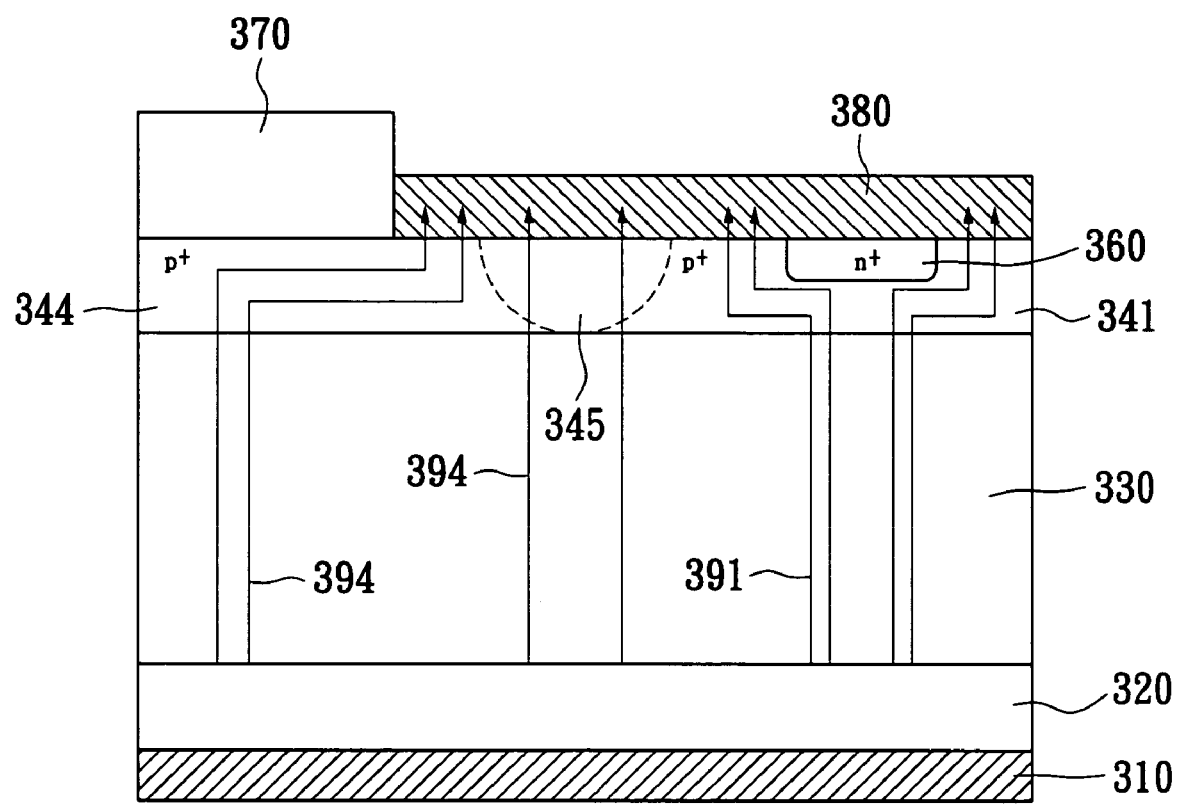
FIG. 7 illustrates a sectional view along line E-E' of FIG. 3.

FIG. 7, a sectional view along the line E-E' in FIG. 3, illustrates the flow of ruggedness current in the power MOSFET as per this invention. (345) is where the p+ body area (341) and the p-type edge area (344) imbricate, (391) is the ruggedness current flowing through the p+ body area (341), and (394) is the ruggedness flowing through the p-type edge area (344). For the sake of convenience, the p-body area (342) is omitted from FIG. 7. Conversely and also for the sake of convenience, the PSG layer (370) in FIG. 7 is not shown in FIG. 3. As described earlier, because the end of the source electrode (380) is arranged closer to the p-type edge area (344) than the end of the n+ source area (360), the ruggedness current flowing through the p-type edge area (344) exits directly to the source electrode (380).

EFFECTS OF THE INVENTION

The power MOSFET as per this invention employs a p-type edge area having multiple sub-areas for reduced breakdown voltage. This ensures proper dispersion of ruggedness current and further improves the overall ruggedness of the power MOSFET.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. A power semiconductor device having an improved ruggedness, comprising:
    a power semiconductor possessing a drain area of conductivity type 1;
    a primary epitaxial area of conductivity type 1, arranged on top of the drain area;
    multiple primary and secondary body areas of conductivity type 2, arranged on top of the primary epitaxial area in a stripe configuration;
    a secondary epitaxial area of conduction type 1, formed between primary body areas;
    an edge area of conduction type 2, formed below the secondary epitaxial area to surround the second body areas and connected to the two ends of the second body areas;
    multiple source areas of conduction type 1, formed within a specific area within the primary body areas, wherein a plurality of source electrodes are formed to electrically connect with the source areas and the ends of the source electrodes are arranged closer to the edge area than the ends of the source areas; and
    gate dielectrics formed on the source areas, primary body areas, and secondary epitaxial areas;
    wherein the edge area is formed with multiple sub-areas.

2. The power semiconductor device as in claim 1, wherein the sub-areas possess spherical edges.

3. The power semiconductor device as in claim 1, wherein the sub-areas are distanced narrower than the secondary body areas.

4. A power semiconductor device having an improved ruggedness, comprising:
    a power semiconductor having a drain area of conductivity type 1;
    a primary epitaxial area of conductivity type 1, arranged on top of the drain area;
    multiple primary and secondary body areas of conductivity type 2, arranged on the primary epitaxial area in a stripe configuration;
    a secondary epitaxial area of conduction type 1, formed between primary body areas;
    an edge area of conduction type 2, formed below the secondary epitaxial area to surround the second body areas and connected to the two ends of the second body areas;
    multiple source areas of conduction type 1, formed within a specific area within the primary body areas, wherein a plurality of source electrodes are formed to electrically connect with the source areas and the ends of the source electrodes are arranged closer to the edge area than the ends of the source areas; and
    gate dielectrics formed on the source areas, primary body areas, and secondary epitaxial areas;

wherein the edge area is comprised of sharp and blunt sections, where the blunt section is concavo-convex.

5. The power semiconductor device as in claim 4, wherein the concavo-convex sections's convexities are spherical.

6. The power semiconductor device as in claim 1, wherein the conduction type 1 is n-type and conduction type 2 is p-type.

* * * * *